United States Patent
Kohda

(10) Patent No.: US 10,270,024 B2
(45) Date of Patent: Apr. 23, 2019

(54) PIEZOELECTRIC RESONATOR ELEMENT, PIEZOELECTRIC DEVICE USING THE PIEZOELECTRIC RESONATOR ELEMENT, METHOD FOR PRODUCING THE PIEZOELECTRIC RESONATOR ELEMENT, AND METHOD FOR PRODUCING THE PIEZOELECTRIC DEVICE USING THE PIEZOELECTRIC RESONATOR ELEMENT

(71) Applicant: DAISHINKU CORPORATION, Kakogawa-shi, Hyogo (JP)

(72) Inventor: Naoki Kohda, Kakogawa (JP)

(73) Assignee: DAISHINKU CORPORATION, Kakogawa-Shi (JP)

( * ) Notice: Subject to any disclaimer, the term of this patent is extended or adjusted under 35 U.S.C. 154(b) by 346 days.

(21) Appl. No.: 15/030,866

(22) PCT Filed: Sep. 10, 2014

(86) PCT No.: PCT/JP2014/073922
§ 371 (c)(1),
(2) Date: Apr. 21, 2016

(87) PCT Pub. No.: WO2015/060032
PCT Pub. Date: Apr. 30, 2015

(65) Prior Publication Data
US 2016/0260886 A1  Sep. 8, 2016

(30) Foreign Application Priority Data

Oct. 22, 2013 (JP) .................. 2013-218778
Jul. 29, 2014 (JP) .................. 2014-154231

(51) Int. Cl.
*H01L 41/04*      (2006.01)
*H01L 41/047*    (2006.01)
(Continued)

(52) U.S. Cl.
CPC ........ *H01L 41/0477* (2013.01); *H01L 41/053* (2013.01); *H01L 41/29* (2013.01);
(Continued)

(58) Field of Classification Search
CPC ..................... H01L 41/047; H01L 41/0477
(Continued)

(56) References Cited

U.S. PATENT DOCUMENTS 6,723,281 B1    4/2004  Ueno et al.
2009/0066193 A1*  3/2009  Glicksman ............... B22F 9/28
                                                                310/363
2012/0248943 A1* 10/2012  Ogashiwa ............ H03H 9/0547
                                                                310/363

FOREIGN PATENT DOCUMENTS

JP    2000-332561 A    11/2000
JP    2001-44785 A      2/2001
(Continued)

*Primary Examiner* — Derek J Rosenau
(74) *Attorney, Agent, or Firm* — American Patent Works

(57) ABSTRACT

A crystal resonator element 2 has excitation electrodes 23a, 23b formed on front and back main surfaces of a crystal resonator plate. Each of the excitation electrodes is made of a ternary alloy containing silver as a major component, a first additive, and a second additive. The first additive is a metal element having a lower sputtering yield than silver and being resistant to corrosion in an etching liquid. The second additive is an element for forming a solid solution with silver. Outer peripheries of the excitation electrodes are first additive-rich regions 9 in which the first additive is rich.

3 Claims, 12 Drawing Sheets

(51) Int. Cl.
  *H03H 9/19* (2006.01)
  *H03H 9/13* (2006.01)
  *H01L 41/053* (2006.01)
  *H01L 41/29* (2013.01)
  *H03H 3/02* (2006.01)

(52) U.S. Cl.
  CPC ............... *H03H 9/13* (2013.01); *H03H 9/19* (2013.01); *H03H 2003/022* (2013.01)

(58) Field of Classification Search
  USPC ........................................................ 310/363
  See application file for complete search history.

(56) References Cited

FOREIGN PATENT DOCUMENTS

| | | | |
|---|---|---|---|
| JP | 2001-77652 | A | 3/2001 |
| JP | 2001-192752 | A | 7/2001 |
| JP | 2002-141760 | A | 5/2002 |

\* cited by examiner

FIG.21 PriorArt
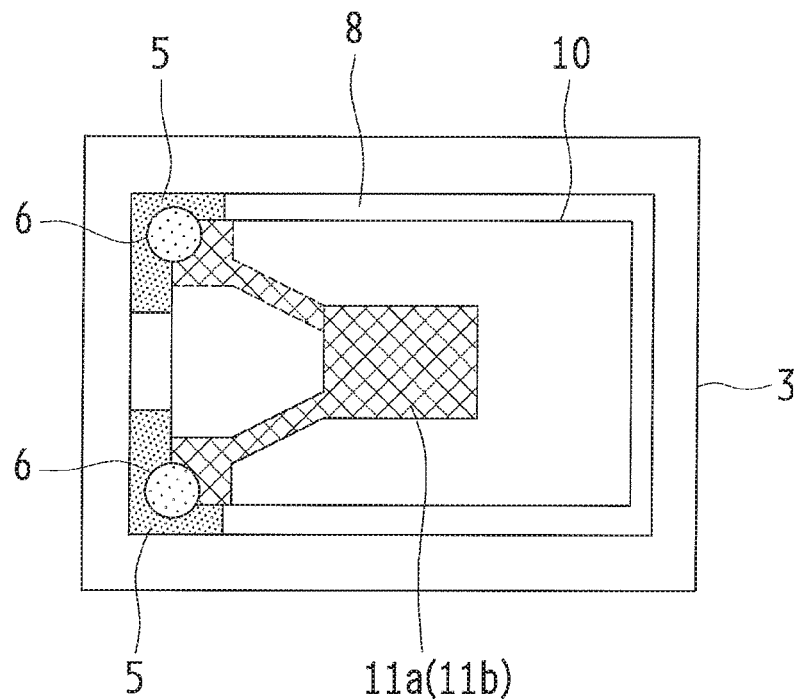
FIG.22 PriorArt
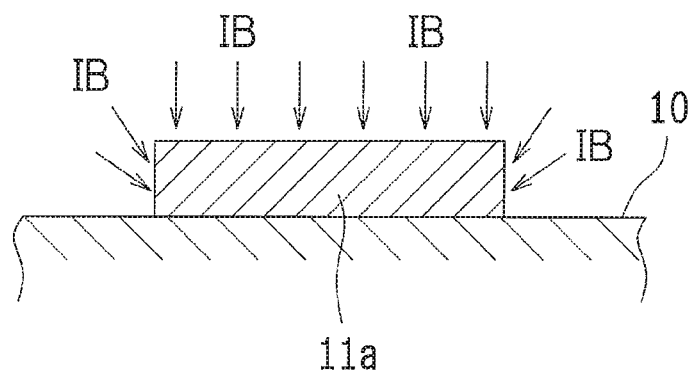

2

PIEZOELECTRIC RESONATOR ELEMENT, PIEZOELECTRIC DEVICE USING THE PIEZOELECTRIC RESONATOR ELEMENT, METHOD FOR PRODUCING THE PIEZOELECTRIC RESONATOR ELEMENT, AND METHOD FOR PRODUCING THE PIEZOELECTRIC DEVICE USING THE PIEZOELECTRIC RESONATOR ELEMENT

TECHNICAL FIELD

The present invention relates to a piezoelectric resonator element and a piezoelectric device using the piezoelectric resonator element, and also relates to a method for producing the piezoelectric resonator element and a method for producing the piezoelectric device using the piezoelectric resonator element.

BACKGROUND ART

Piezoelectric devices such as crystal resonators have been utilized in communication devices and in other various fields. For example, a conventional surface-mount crystal resonator, as shown in FIG. 21, is composed mainly of a crystal resonator element 10 in which electrodes including an excitation electrode 11a (and another excitation electrode 11b on the backside) are provided on a crystal resonator plate, a holder 3 having a recess 8 for accommodating the crystal resonator element 10, and a lid (not shown) for hermetically sealing the recess 8 by being bonded to the holder 3. The crystal resonator element 10 has a plate-like shape, an end of which is cantilevered and bonded by conductive adhesives 6, 6 on electrode pads 5, 5 inside the recess 8. The crystal resonator having this configuration is disclosed, for example, in Patent Literature 1 and Patent Literature 2.

For example, in the case of an AT-cut crystal resonator plate whose oscillation frequency is inversely proportional to its thickness, the frequency is adjusted by addition of excitation electrodes to the front and back main surfaces of the crystal resonator plate and partial removal of the added excitation electrodes. To start with, excitation electrodes having a predetermined thickness are added to the front and back main surfaces of the AT-cut crystal resonator plate, which decreases the frequency to a range slightly lower than a target frequency. This adjustment is called coarse frequency adjustment. After the "coarse frequency adjustment", the crystal resonator element is conductively bonded on the inside of the holder. In this state, the excitation electrodes are irradiated entirely, for example, by an ion beam. Ion beam irradiation to the excitation electrodes decreases the mass of the excitation electrodes and increases the frequency to the target frequency. This adjustment is called fine frequency adjustment.

CITATION LIST

Patent Literature

[Patent Literature 1] JP 2000-332561 A
[Patent Literature 2] JP 2001-077652 A

DISCLOSURE OF THE INVENTION

Problems to be Solved by the Invention

In the fine frequency adjustment mentioned above, an ion beam (IB), indicated by arrows in FIG. 22, reaches not only the top surface of each excitation electrode but also the ridges and the side surfaces of the excitation electrode. At the ridge and the side surfaces of the excitation electrodes, the mass to be removed by the ion beam irradiation is greater than at the flat top surface. Hence, the frequency adjustment rate (the amount of frequency adjustment per unit time) is greater at the outer periphery of each excitation electrode than at the central portion. Eventually, the external dimension of each excitation electrode tends to be microscopically smaller than a desired dimension. If the external dimension of each excitation electrode is smaller than a desired dimension, the crystal resonator acquires different parameters or properties and may not ensure desired characteristics.

Silver (Ag) is a common material for excitation electrodes because silver is less expensive than gold (Au). However, silver is inferior to gold in terms of weatherability because a silver surface is prone to oxidation and shows an insufficient chemical resistance.

Generally, in order to reduce thermal stress and strain generated in the production process of a piezoelectric device, a piezoelectric device is exposed to a high temperature for a thermal treatment (annealing). If the excitation electrodes are composed of pure silver (except a foundation layer), silver particles coagulate at a high temperature and cause delamination or disconnection of the electrodes. To avoid such a trouble, the temperature for this thermal treatment cannot be set so high. Besides, because of the trend for miniaturization of a crystal resonator plate, extraction electrodes led out from the excitation electrodes or other like components may be disposed in proximity to the excitation electrodes. In this case, the excitation electrodes composed of pure silver may suffer from an insulation failure due to migration.

The present invention is made in view of the above problems, and aims to provide a piezoelectric resonator element which prevents a decrease in the electrode dimension during the frequency adjustment and which is highly reliable with excellent weatherability and thermal resistance. The present invention also aims to provide a piezoelectric device using the piezoelectric resonator element, a method for producing the piezoelectric resonator element, and a method for producing the piezoelectric device using the piezoelectric resonator element.

Means for Solving the Problems

In order to accomplish the above-mentioned object, the invention according to claim 1 provides a piezoelectric resonator element which includes a pair of excitation electrodes for driving a piezoelectric resonator plate. Each of the excitation electrodes is composed of a ternary alloy containing silver as a major component, a first additive, and a second additive. The first additive is a metal element which has a lower sputtering yield than silver and which is resistant to corrosion in an etching liquid. The second additive is an element for forming a solid solution with silver. The first additive is rich at an outer periphery of each of the excitation electrodes. In this context, the terms "rich in the first additive", "first additive-rich" and other like expressions mean that the concentration of the first additive per unit volume is higher at the outer periphery of an excitation electrode than at an inner region of the excitation electrode.

The above invention can prevent a microscopic decrease in the external dimension of each excitation electrode because the first additive is rich at the outer periphery of the excitation electrode. The first additive is a metal element having a smaller sputtering yield than silver. Hence, when, for example, the frequency of a piezoelectric resonator element is adjusted by decreasing the mass of the excitation electrodes by sputtering, the outer peripheries of the excitation electrodes in the present invention are resistant to sputtering in comparison with the outer peripheries of conventional excitation electrodes (pure silver). Hence, it is possible to prevent a decrease in the external dimension of each excitation electrode. Incidentally, the sputtering yield (sputtering rate) is obtained, for example, in the case of ion beam sputtering, by dividing the number of sputtered atoms by the number of emitted ions.

Since the first additive is rich at the outer peripheries of the excitation electrodes, the first additive also functions like "a barrier" and can inhibit migration even in a micro-wiring arrangement.

Further according to the above invention, since the first additive is resistant to corrosion in an etching liquid, addition of the first additive to silver makes the surfaces resistant to oxidation and thereby enhances the oxidation resistance and the chemical resistance. Hence, when, for example, patterns of the various electrodes are formed in predetermined shapes by photolithography, this arrangement allows side surfaces of each metal film under a resist to be rich in the first additive during metal etching and can therefore inhibit excessive etching (side etching). During the metal etching, use of an alloy containing silver and the first additive can reduce the etching yield in comparison with the case of using pure silver. Eventually, the patterns of the excitation electrodes and the other electrodes can be formed efficiently.

Also according to the above invention, the second additive is an element for forming a solid solution with silver, and atoms of the second additive enter gaps in a silver crystal lattice to form a solid solution. This eventually inhibits movement of silver atoms and can thereby prevent aggregation of silver particles due to thermal history. It is therefore possible to set a higher temperature in the above-mentioned annealing treatment and to enhance thermal resistance.

In order to accomplish the above-mentioned object, the invention according to claim 2 is arranged such that the alloy contains palladium as the first additive and copper as the second additive.

According to the above invention, presence of palladium as the first additive makes the surfaces resistant to oxidation and thereby enhances the oxidation resistance and the chemical resistance. Hence, when, for example, patterns of the various electrodes are formed in predetermined shapes by photolithography, this arrangement allows side surfaces of each metal film under a resist to be rich in palladium during metal etching and can therefore inhibit excessive side etching. This is because palladium per se has excellent weatherability such as oxidation resistance and chemical resistance, and can exhibit its excellent weatherability also in the silver alloy containing palladium.

Besides, palladium is a metal element having a lower sputtering yield than silver, and mixes evenly with silver while targets are formed by sputtering. Hence, palladium is desirable in making outer peripheries of the electrodes in a palladium-rich state.

Copper, as the second additive, forms an interstitial solid solution with silver by allowing copper atoms to enter gaps in a silver crystal lattice. This eventually inhibits movement of silver atoms and can thereby prevent aggregation of silver particles due to thermal history. It is therefore possible to enhance thermal resistance and to prevent delamination or disconnection of the electrodes.

In order to accomplish the above-mentioned object, the invention according to claim 3 provides a piezoelectric device having the piezoelectric resonator element according to claim 1 or 2. The piezoelectric resonator element is accommodated in a holder and hermetically sealed by a lid bonded on the holder.

The above invention can provide a piezoelectric device having desirable characteristics because the piezoelectric resonator element having the above-described functions and effects is hermetically sealed in the holder.

In order to accomplish the above-mentioned object, the invention according to claim 4 provides a method for producing a piezoelectric resonator element having a pair of excitation electrodes for driving a piezoelectric resonator plate. This method includes the steps of forming metal films, one each, on a front surface and a back surface of the piezoelectric resonator plate, as a metal film formation step, wherein each of the metal films is composed of a ternary alloy containing silver as a major component, a first additive, and a second additive, the first additive being a metal element which has a lower sputtering yield than silver and which is resistant to corrosion in an etching liquid, and a second additive being an element for forming a solid solution with silver; forming a resist on a top surface of each of the metal films; and etching the metal films with use of an etching liquid which is corrosive to silver, as a metal etching step, and thereby making an outer periphery of each of the excitation electrodes rich in the first additive.

According to the above invention, it is possible to produce a piezoelectric resonator element in which the outer peripheries of the excitation electrodes are rich in the first additive. This is achievable because silver can be selectively etched away at the side surfaces of the metal films whose top surfaces are covered by the resists, by forming the metal films each composed of the above-mentioned ternary alloy on the front and back surfaces of the piezoelectric resonator plate in the metal film formation step, forming resists on the top surfaces of the metal films, and then etching the metal films with use of an etching liquid which is corrosive to silver in the metal etching step. In this regard, the etching liquid may be corrosive to not only silver but also the second additive.

In order to accomplish the above-mentioned object, the invention according to claim 5 is arranged such that the alloy contains palladium as the first additive and copper as the second additive.

The above invention can produce a piezoelectric resonator element which exhibits the functions and effects of the invention according to claim 2 above.

In order to accomplish the above-mentioned object, the invention according to claim 6 provides a method for producing a piezoelectric device. This method includes the steps of bonding a piezoelectric resonator element obtained by the production method according to claim 4 or 5 to an inside of a holder; conducting fine adjustment of a frequency of the piezoelectric resonator element by irradiating the excitation electrodes by an ion beam and reducing a mass of the excitation vibrator electrodes, and sealing the piezoelectric resonator element hermetically by bonding a lid on the holder.

According to the above invention, it is possible to produce a piezoelectric device while preventing a microscopic decrease in the external dimension of each excitation electrode during the frequency adjustment. This is not only because the first additive is rich at the outer peripheries of the excitation electrodes of the piezoelectric resonator element but also because the first additive is a metal element having a lower sputtering yield than silver and thus is resistant to sputtering by ion beam irradiation in comparison with silver.

Advantageous Effects of Invention

As described above, the present invention can provide a piezoelectric resonator element which prevents a decrease in the electrode dimension during the frequency adjustment and which is highly reliable with excellent weatherability and thermal resistance. The present invention can also provide a piezoelectric device using the piezoelectric resonator element, a method for producing the piezoelectric resonator element, and a method for producing the piezoelectric device using the piezoelectric resonator element.

BRIEF DESCRIPTION OF THE DRAWINGS

FIG. 21 is a schematic view showing a top surface of a conventional crystal resonator.

FIG. 22 is a schematic cross-sectional view showing an excitation electrode in a conventional crystal resonator element.

BEST MODE FOR CARRYING OUT THE INVENTION

Figure 1:
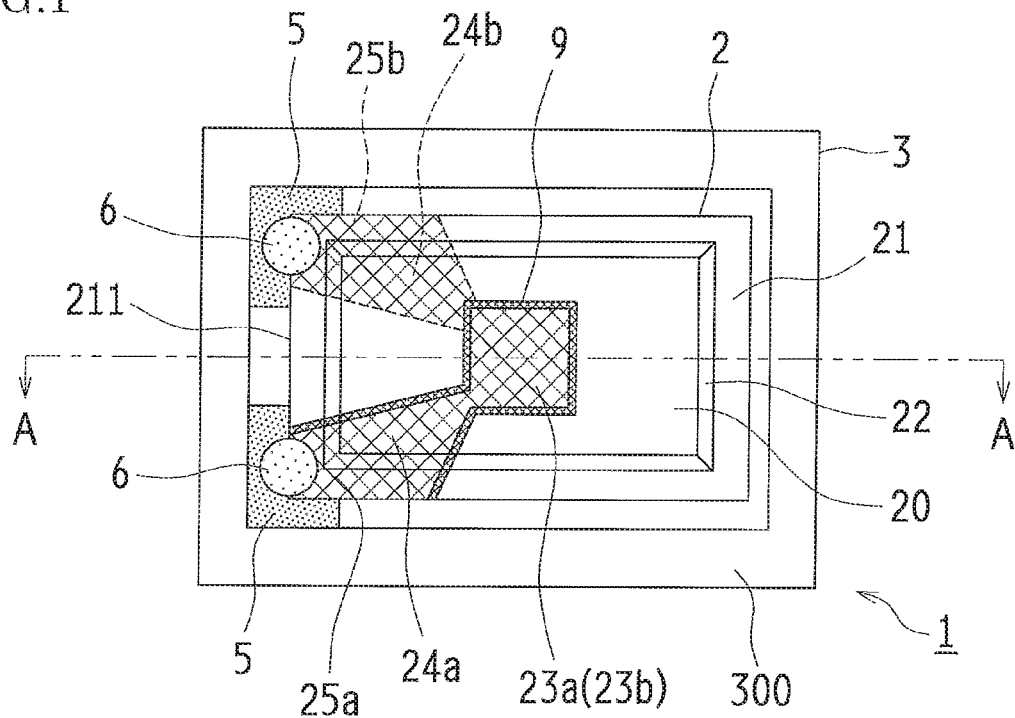
FIG. 1 is a schematic view showing a top surface of a crystal resonator in an embodiment of the present invention.
Figure 2:
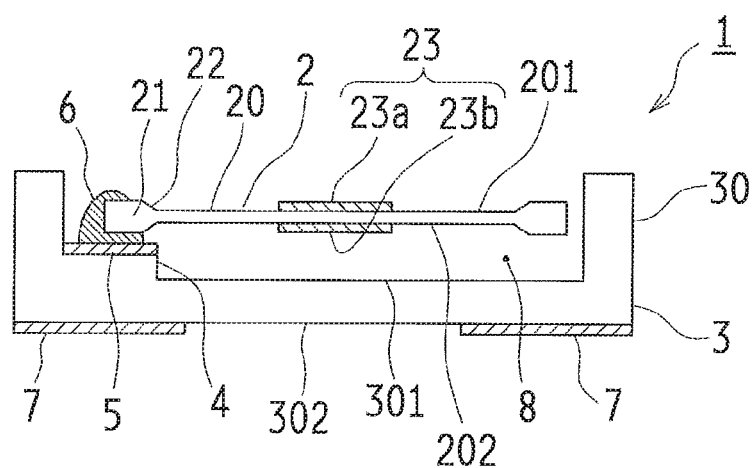
FIG. 2 is a schematic cross-sectional view taken along the line A-A in FIG. 1.

Hereinafter, an embodiment of the present invention is described with reference to the drawings, with a crystal resonator taken as an example of the piezoelectric device. In the present embodiment, a crystal resonator 1 is a surface-mount crystal resonator having a substantially cuboid package structure. For convenience of description, the crystal resonator in FIGS. 1 and 2 is illustrated with a lid (described later) removed. Main components of the crystal resonator 1 are a holder 3 having a recess 8, a crystal resonator element 2, and a flat plate-like lid (not shown) for sealing the recess 8. The crystal resonator element 2 is hermetically sealed in the recess 8 by the lid bonded to the holder 3. The holder 3 and the lid are bonded by seam welding in the present embodiment, but may be alternatively bonded by other bonding techniques. For example, the lid and the holder may be bonded by fusing with use of a glass resin molten under a heated atmosphere or with use of an alloy such as gold-tin (AuSn) molten under a heated atmosphere.

In FIGS. 1 and 2, the holder 3 has a box-shaped body made of an insulating material whose main component is a ceramic such as alumina. To form the holder 3, ceramic green sheets are laminated and sintered into a single piece. In plan view, the holder 3 has a bank 30 formed all around the holder 3 in plan view and a rectangular recess 8 inside the bank 30. A shoulder 4 is formed at an end of an inner bottom surface 301 of the recess 8. A pair of crystal resonator element-mounting pads (electrodes) 5, 5 is arranged in parallel on a top surface of the shoulder 4. To form this pair of crystal resonator element-mounting pads 5, 5, for example, metal layers are laminated (in the order of nickel and gold) on the top surface of a tungsten metallized layer by plating or like technique. The pair of crystal resonator element-mounting pads 5, 5 is electrically connected to a part of a plurality of external connection terminals 7 provided on an outer bottom surface 302 of the holder 3, via internal wiring (not shown) formed inside the holder 3.

In FIG. 1, a bonding member (not shown) is formed all around on a top surface 300 of the bank 30 in plan view. In the present embodiment, the bonding member has a three-layer structure composed of a tungsten metallized layer at the bottom, a nickel-plated layer in the middle, and a gold-plated layer at the top. Tungsten may be substituted with molybdenum. The bonding member matches an outer periphery of the lid (not shown).

The lid is a metallic lid member which has a kovar substrate and which is rectangular in plan view. Nickel-plated layers are formed on the front and back surfaces of the lid. On the surface of the lid to be bonded to the holder, a brazing filler metal (not shown) composed of a metal is formed entirely on the nickel-plated layer. In the present embodiment, the brazing filler metal is a silver brazing filler metal.

As shown in FIGS. 1 and 2, the crystal resonator element 2 is a piezoelectric resonator element in which various electrodes are provided on front and back main surfaces of an AT-cut crystal resonator plate having a rectangular shape in plan view. The crystal resonator plate includes a thin portion 20 at a central part thereof as a vibration part, and a thick portion 21 on the outside of the thin portion 20 (so-called inverted mesa shape). The thin portion 20, having a rectangular shape in plan view, is processed to be thinner than a surrounding portion. The thick portion 21, having a frame-like shape, is thicker than the thin portion 20. The thick portion 21 and the thin portion 20 are connected by inclined surfaces 22 whose thickness is gradually reduced toward the thin portion 20. Such an external shape of the crystal resonator plate is made by wet etching. The inclined surfaces 22 are crystal planes exposed by wet etching of the AT-cut crystal resonator plate.

In the crystal resonator plate shown in FIGS. 1 and 2, a pair of excitation electrodes 23a, 23b each having a substantially rectangular shape in plan view is provided approximately at the center of the front and back main surfaces of the thin portion 20. These excitation electrodes are arranged face to face with each other, with an interposition of the thin portion 20. From an area including a corner of the excitation electrode 23a disposed on one main surface 201 of the thin portion 20, an extraction electrode 24a is diagonally led to a corner of a short side 211 of the crystal resonator plate. The other end, a terminal end, of the extraction electrode 24a constitutes an adhesive electrode 25a.

Similarly, from an area including a corner of the excitation electrode 23b disposed on the other main surface 202 of the thin portion 20, an extraction electrode 24b is diagonally led to another corner of the short side 211 of the crystal resonator plate. The other end, a terminal end, of the extraction electrode 24b constitutes an adhesive electrode 25b.

The extraction electrodes 24a, 24b and the adhesive electrodes 25a, 25b are provided in pairs, and are arranged not to overlap with each other in plan view.

In the present embodiment, the width of the pair of extraction electrodes 24a, 24b is not constant but increases gradually from the corners of the excitation electrodes 23a, 23b to the adhesive electrodes 25a, 25b. This shape can effectively prevent spurious generation.

In the present embodiment, the excitation electrodes 23a, 23b, the extraction electrodes 24a, 24b, and the adhesive electrodes 25a, 25b have a structure composed of a chromium (Cr) foundation layer and a silver alloy layer laminated thereon. These metal films are formed by sputtering. Patterns of the excitation electrodes, the extraction electrodes, and the adhesive electrodes are formed by photolithography and etching. Application of photolithography enables highly precise formation of the various electrodes even if the external size of the crystal resonator plate is minute.

The silver alloy is a ternary silver alloy containing silver as a major component, a first additive which is a metal element having a lower sputtering yield than silver and being resistant to corrosion in an etching liquid, and a second additive which is an element for forming a solid solution with silver. Specifically, the silver alloy contains silver as the major component, palladium (Pd) as the first additive, and copper (Cu) as the second additive (an Ag—Pd—Cu alloy). In the present embodiment, the weight ratio of Pd is 1 to 2% and the weight ratio of Cu is 1% or less, relative to the total Ag—Pd—Cu alloy. The composition of the silver alloy should not be limited to silver-palladium-copper as given above, but may be other compositions. For example, the silver alloy may contain silver as the major component, titanium (Ti) as the first additive, and carbon (C) as the second additive. Additionally, the first additive may be neodymium (Nd).

Presence of palladium as the first additive makes the surfaces resistant to oxidation and thereby enhances the oxidation resistance and the chemical resistance. Hence, when patterns of the various electrodes are formed in predetermined shapes, for example, by photolithography, side surfaces of each metal film under a resist are rich in palladium during metal etching and can therefore inhibit excessive side etching. This is because palladium per se has excellent weatherability such as oxidation resistance and chemical resistance, and can exhibit its excellent weatherability also in the silver alloy containing palladium.

Besides, palladium is a metal element having a lower sputtering yield than silver, and mixes evenly with silver while targets are formed by sputtering. Thus, palladium is desirable in making outer peripheries of the electrodes in a palladium-rich state.

Copper, as the second additive, forms an interstitial solid solution with silver by allowing copper atoms to enter gaps in a silver crystal lattice. This eventually inhibits movement of silver atoms and can thereby prevent aggregation of silver particles due to thermal history. It is therefore possible to enhance thermal resistance and to prevent delamination or disconnection of the electrodes.

In FIG. 1, the outer peripheries of the pair of excitation electrodes 23 (23a, 23b), the outer peripheries of the pair of extraction electrodes 24 (24a, 24b), and the outer peripheries of the pair of adhesive electrodes 25 (25a, 25b) are rich in the first additive, palladium. These outer peripheries are illustrated as first additive-rich regions 9 in FIG. 1.

Incidentally, in the case of the conventional crystal resonator element 10, if a central portion of the crystal resonator element 10 (see FIG. 22) is processed into an inverted mesa shape and further if extraction electrodes from the excitation electrodes (11a, 11b) are formed on inclined surfaces 22 of the crystal resonator element 10, it is probable that outer peripheries of the extraction electrodes may be delaminated.

In the present invention, on the other hand, the outer peripheries of the pair of excitation electrodes 23, the outer peripheries of the pair of extraction electrodes 24, and the outer peripheries of the pair of adhesive electrodes 25 are rich in palladium. Since palladium has a higher Vickers hardness than silver, it is possible to prevent delamination of the electrodes from the outer peripheries of the electrodes 23, 24, 25.

The adhesive electrodes 25a, 25b provided at an end of the long sides of the crystal resonator element 2 are conductively bonded on the crystal resonator element-mounting pads 5, 5 via the conducting adhesives 6, 6. In the present embodiment, the conducting adhesives 6 are silicone-based conductive resin adhesives, but may also be non-silicone-based conducting adhesives. Incidentally, the means for conductively bonding the crystal resonator element and the crystal resonator element-mounting pads is not limited to conducting adhesives, and other bonding means are also applicable. For example, the crystal resonator element and the crystal resonator element-mounting pads may be conductively bonded by thermocompression bonding with application of ultrasonic waves via conductive bumps (so-called FCB, or Flip Chip Bonding).

Turning next to FIGS. 3 to 9, a method for producing the crystal resonator element 2 according to the present invention is described below. Illustrations in FIGS. 3 to 9 are simplified by drawing the crystal resonator plate as a flat plate, omitting the extraction electrodes and the adhesive electrodes, and showing the excitation electrodes only.

—Metal Film Formation Step—

Figure 3:
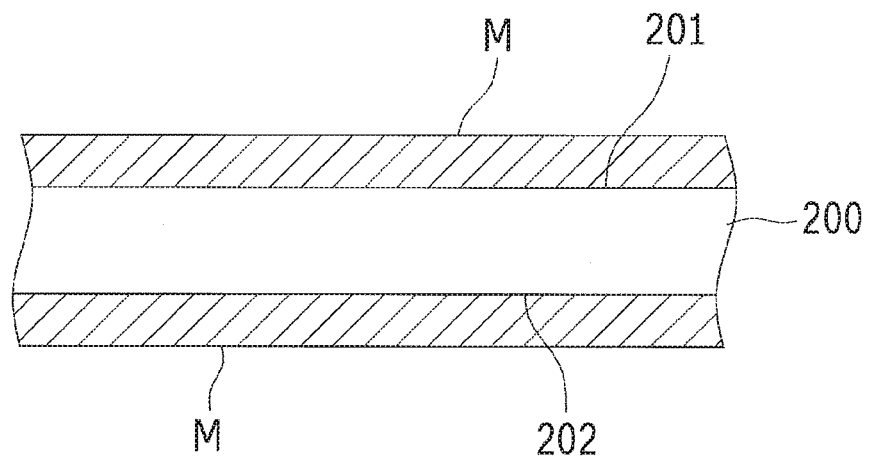
FIG. 3 is a schematic cross-sectional view showing a method for producing a crystal resonator element in the embodiment of the present invention.

First of all, as shown in FIG. 3, metal films M are formed by sputtering on the entirety of the front and back main surfaces (201, 202) of a quartz crystal wafer 200 on which a multiplicity of crystal resonator elements 2 are to be made (metal film formation step). For simplicity, FIGS. 3 to 9 only show a formation area for one unit of crystal resonator plate, with omitting the extraction electrodes and the adhesive electrodes mentioned above.

Each metal film M has a layer structure composed of a chromium foundation layer and a silver alloy (Ag—Pd—Cu alloy) layer laminated thereon, the silver alloy containing silver as the major component, a trace amount of palladium (the first additive), and a trace amount of copper (the second additive). Palladium, as the first additive, is a metal element having a lower sputtering yield than silver and being resistant to corrosion in an etching liquid. Copper, as the second additive, is an element for forming a solid solution with silver. The chromium layer is so much thinner than the silver alloy layer that illustration of the chromium layer is omitted in all cross-sectional views.

—Resist Formation Step—

Figure 4:
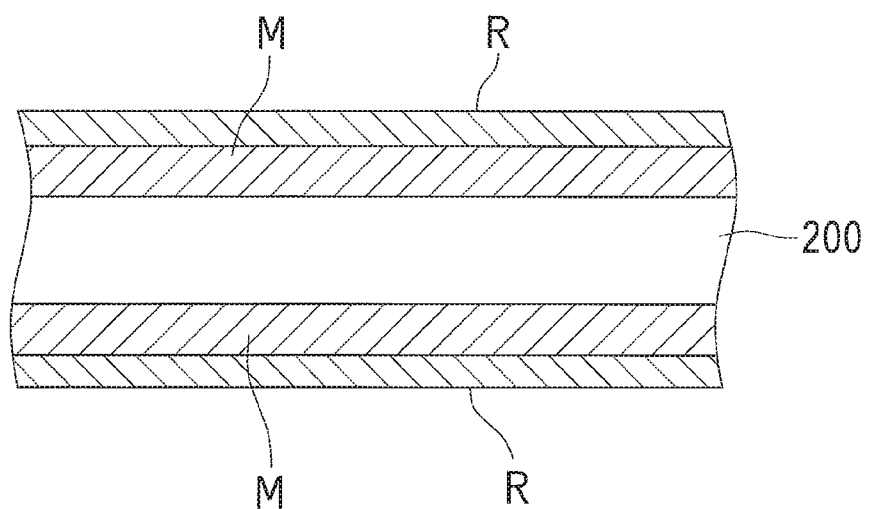
FIG. 4 is a schematic cross-sectional view showing a method for producing the crystal resonator element in the embodiment of the present invention.

Next, resists R are formed on the metal films M covering the entirety of the front and back main surfaces of the quartz crystal wafer 200 (FIG. 4). In the present embodiment, the resists R are positive resists.

—Light Exposure & Development Step—

Figure 5:
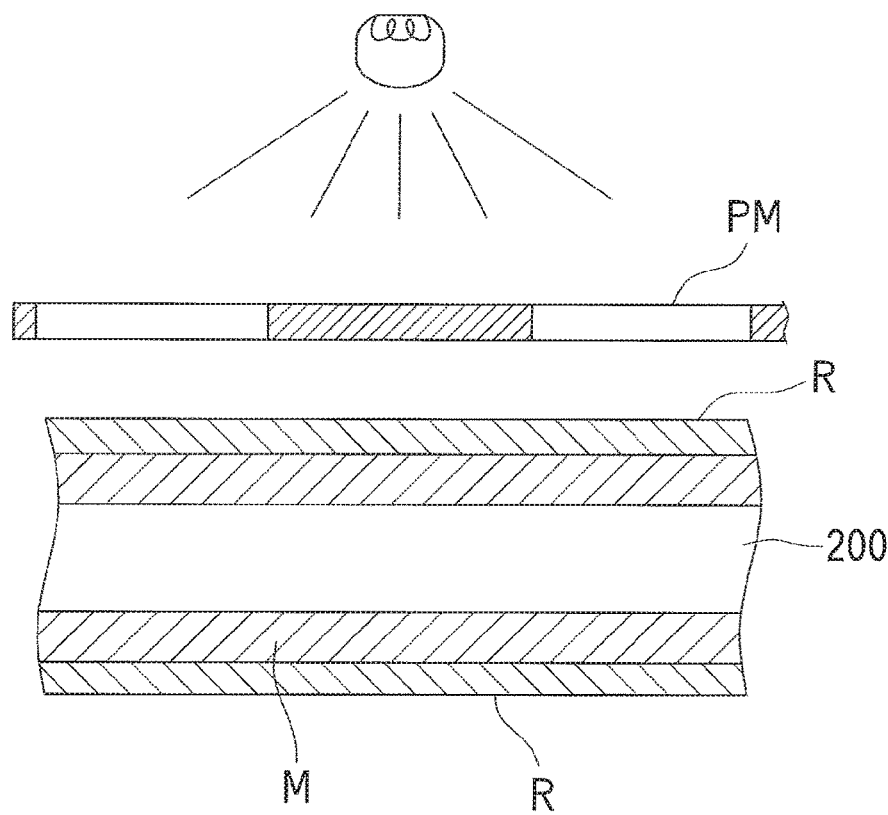
FIG. 5 is a schematic cross-sectional view showing a method for producing the crystal resonator element in the embodiment of the present invention.
Figure 6:
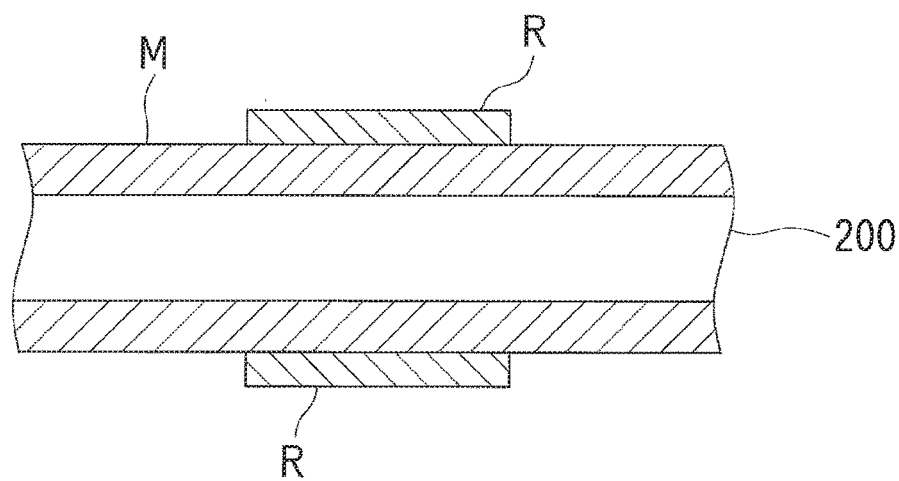
FIG. 6 is a schematic cross-sectional view showing a method for producing the crystal resonator element in the embodiment of the present invention.

Then, as shown in FIG. 5, a photomask pattern is transferred by irradiation of the resist R with light (ultraviolet ray) via a photomask PM having an opening in a predetermined shape (light exposure step). FIG. 5 shows a light exposure process on one side of the resist R. After a developing process, sensitized regions of the resists are removed as shown in FIG. 6, thereby uncovering parts of the metal films M under the resist-removed regions (development step).

—Metal Etching Step—

Figure 7:
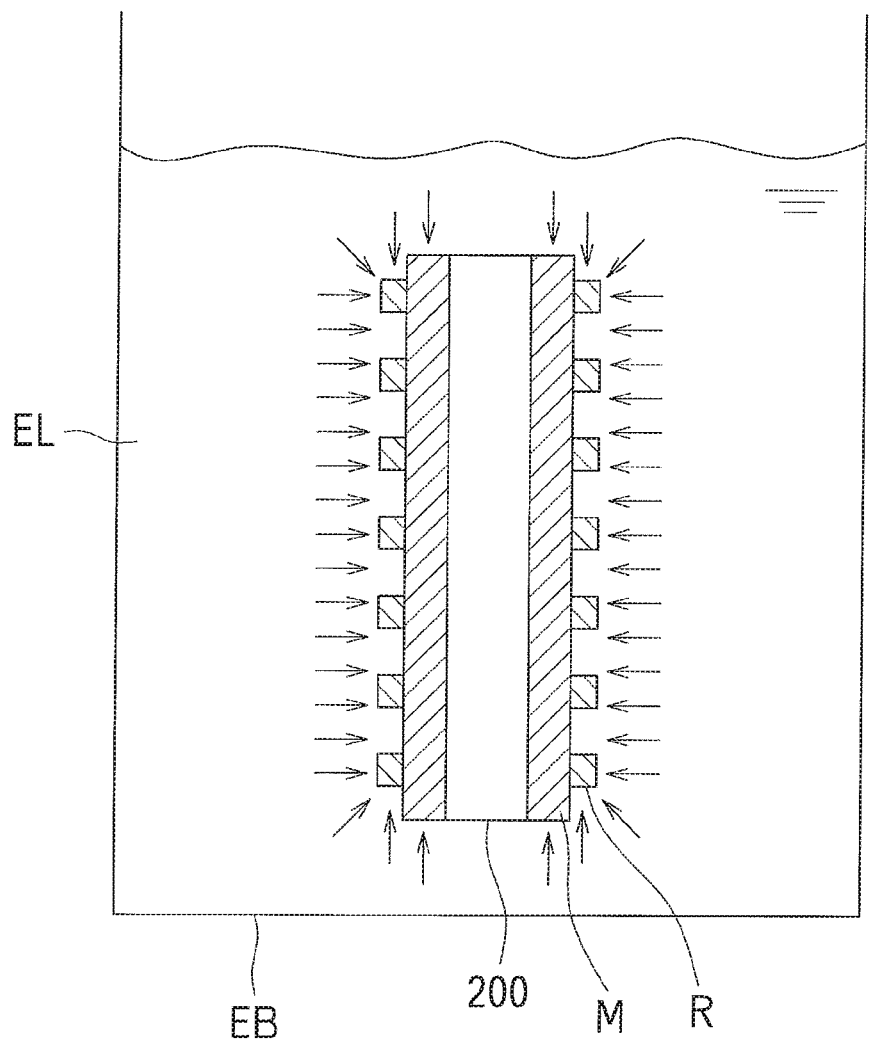
FIG. 7 is a schematic cross-sectional view showing a method for producing the crystal resonator element in the embodiment of the present invention.

Next, as shown in FIG. 7, the crystal resonator plate is dipped in a container EB filled with an etching liquid EL (a metal etching liquid) which is corrosive to silver and copper. Thereby, regions of the metal films M that are not covered by the residual resists R (hereinafter abbreviated as "uncovered regions") are removed (metal etching step). The etching liquid EL is a nitric acid-based solution in the present embodiment, but an etching liquid based on a different ingredient is also applicable.

Figure 8:
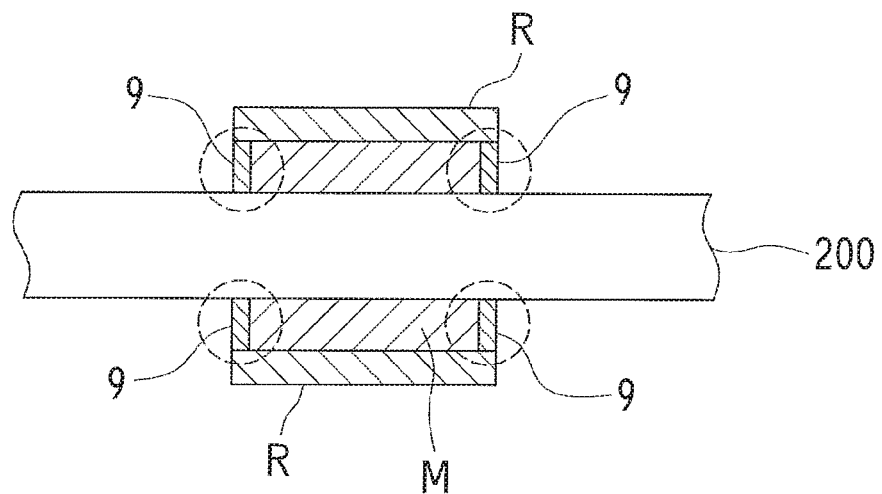
FIG. 8 is a schematic cross-sectional view showing a method for producing the crystal resonator element in the embodiment of the present invention.
Figure 9:
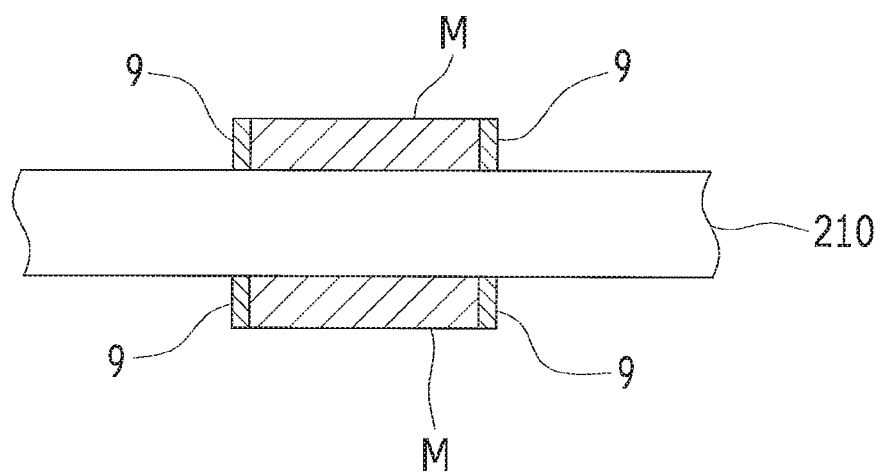
FIG. 9 is a schematic cross-sectional view showing a method for producing the crystal resonator element in the embodiment of the present invention.

During the metal etching step, silver and copper contained in the uncovered regions of the metal films M dissolve into the etching liquid, whereas palladium contained in the metal films M is less likely to dissolve into the etching liquid, so that the ratio of palladium increases in the metal films M. Eventually, the amount of palladium at the side surfaces of the metal films M under the residual resists becomes greater than in the rest of the metal films M except the side surfaces. In other words, the palladium concentration at the outer peripheries of the excitation electrodes is higher (palladium-rich), per unit volume, than the inner regions of the excitation electrodes surrounded by the side surfaces (FIG. 8). In FIGS. 8 and 9, the palladium-rich regions are indicated by reference numeral 9.

—Resist Stripping Step—

Lastly, the residual resists R are removed to give a quartz crystal wafer 210 on which a multiplicity of crystal resonator elements 2, 2, . . . , 2 are formed in an integrated manner.

Each crystal resonator element has the excitation electrodes 23a, 23b whose outer peripheries are rich in palladium (FIG. 9).

According to the above-described method of the present invention for producing the crystal resonator element, it is possible to produce crystal resonator elements in each of which the outer peripheries of the excitation electrodes are rich in palladium. This is achievable because silver can be selectively etched away at the side surfaces of the metal films whose top surfaces are covered by the resists, by the steps including: forming the metal films M each composed of the above-mentioned ternary alloy on the front and back surfaces of the crystal resonator plate in the metal film formation step, forming resists on the top surfaces of the metal films M, and then etching the metal films with use of an etching liquid which is corrosive to silver and copper in the metal etching step.

Figure 10:
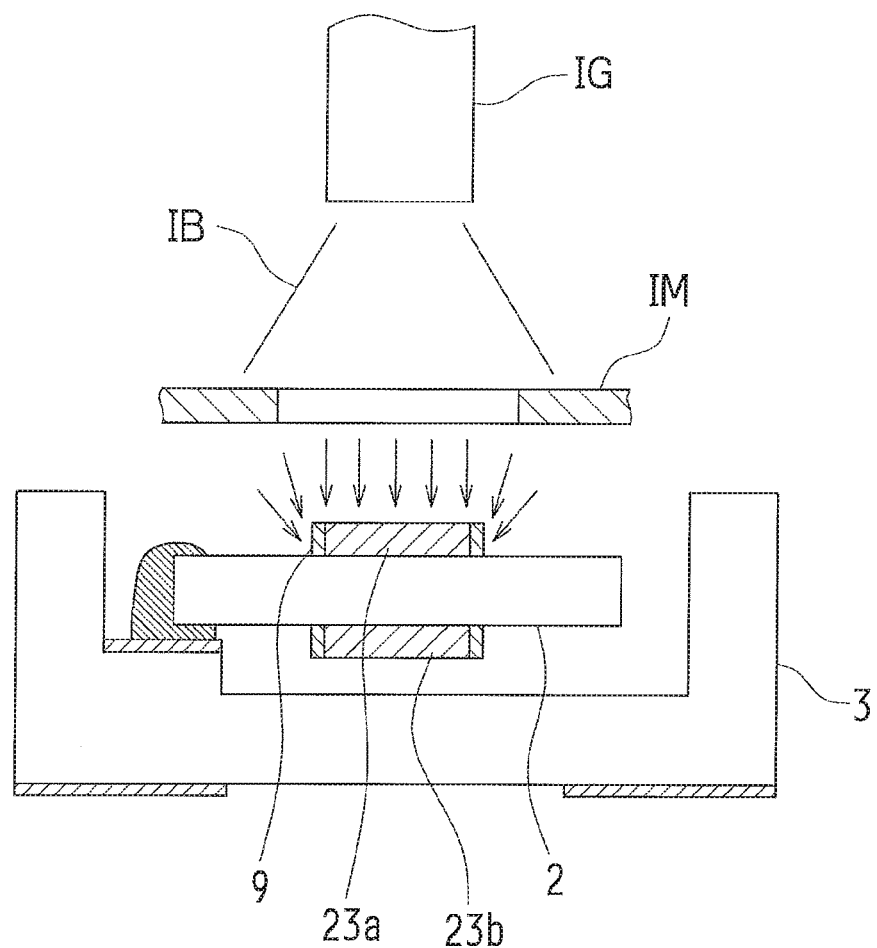
FIG. 10 is a schematic cross-sectional view showing a method for producing the crystal resonator in the embodiment of the present invention.

Next, the method for producing the crystal resonator 1 according to the present invention is described with reference to FIG. 10. From the quartz crystal wafer 210 obtained by the above production method, crystal resonator elements 2 are separated piece by piece. One such crystal resonator element 2 is conductively bonded, via the conducting adhesives 6, 6, on the crystal resonator element-mounting pads (electrodes) 5, 5 disposed on the top surface of the shoulder 4 in the holder 3 (bonding step).

After the bonding step, an ion beam IB (argon ions Ar+) is emitted from an ion gun IG to the excitation electrode 23a of the crystal resonator (FIG. 10), through a partial mask IM which has a greater opening than the area of the excitation electrode in plan view. By setting the emission diameter of argon ions not smaller than the opening diameter of the partial mask, argon ions collide with the entirety of the excitation electrode. This process (so-called ion milling) reduces the mass of the excitation electrode and enables fine adjustment of the frequency of the crystal resonator element (fine adjustment step). An ionized inert gas, other than argon, may be also used as the ion beam. Incidentally, the present embodiment also includes a coarse adjustment step which precedes the fine adjustment step. The coarse adjustment step is conducted to decrease the frequency to a desired range by forming excitation electrodes or other electrodes on the front and back main surfaces of the AT-cut crystal resonator plate. In the coarse adjustment step, the frequency is adjusted to a greater extent than in the fine adjustment step.

In the fine adjustment step, the outer peripheries of the excitation electrodes are rich in the first additive, palladium. Palladium has a lower sputtering yield than silver, and thus is resistant to sputtering by ion beam irradiation than silver. Owing to this arrangement, it is possible to prevent a decrease in the external dimension of the excitation electrodes.

After the fine adjustment step, the lid is bonded on the holder 3 to seal the crystal resonator element 2 hermetically in the recess 8 (sealing step). This is the final step in the method for producing the crystal resonator according to the present invention.

Figure 11:
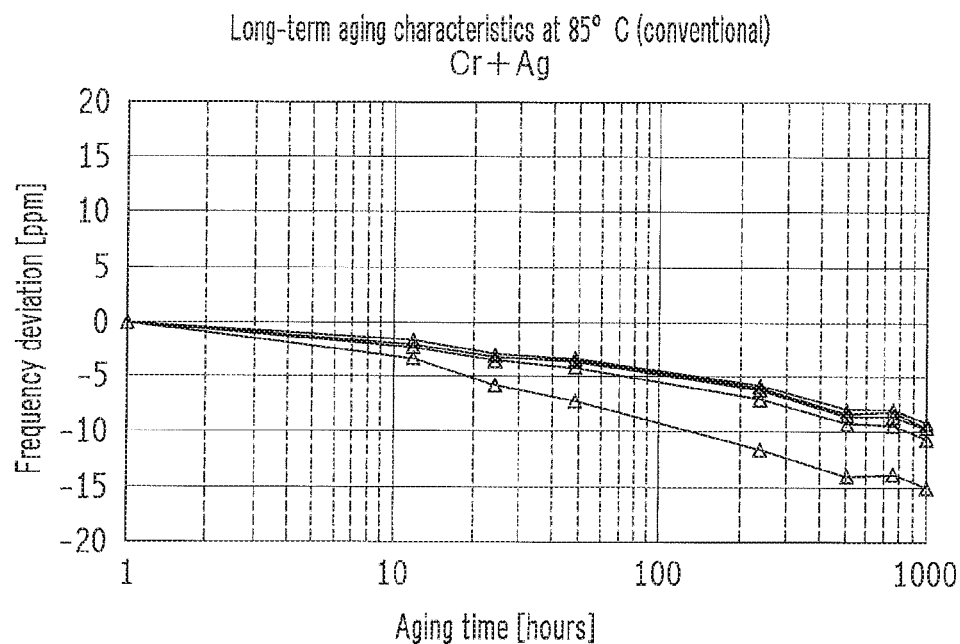
FIG. 11 is a graph showing aging characteristics of conventional crystal resonators.
Figure 12:
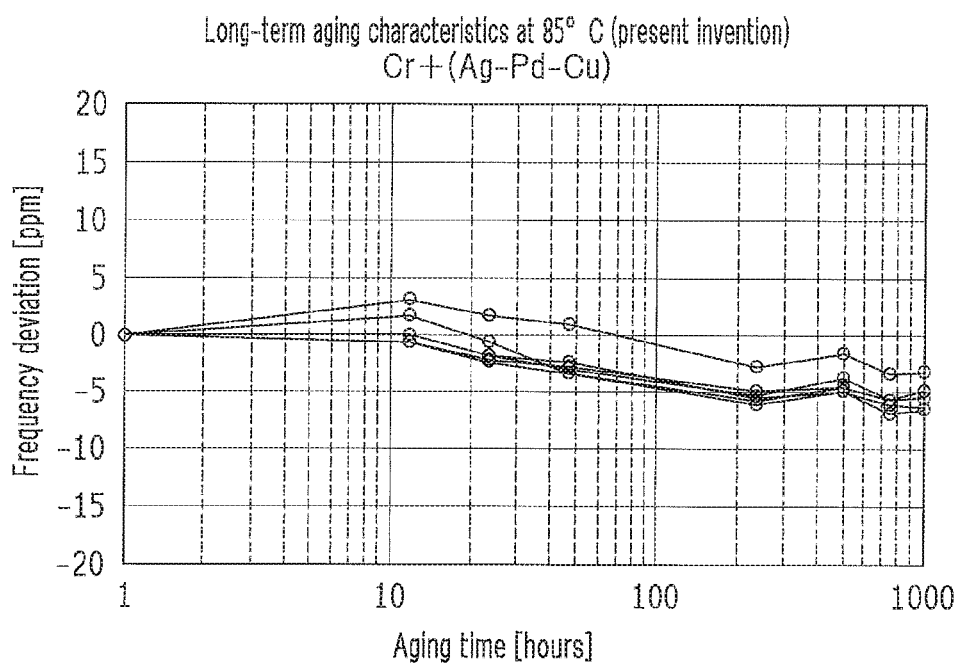
FIG. 12 is a graph showing aging characteristics of crystal resonators according to the present invention.
Figure 13:
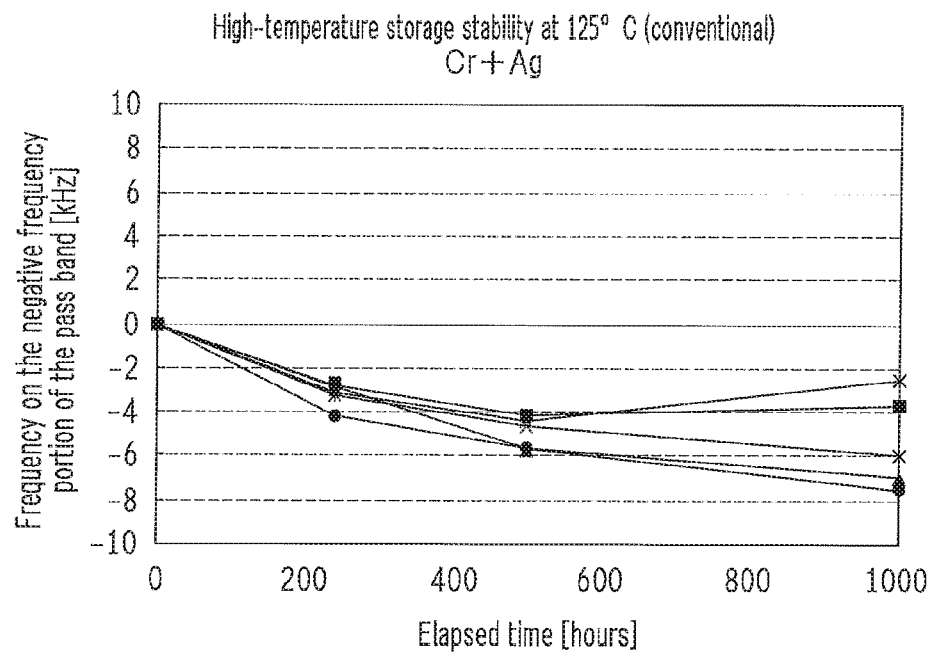
FIG. 13 is a graph showing high-temperature storage stability of conventional crystal filters.
Figure 14:
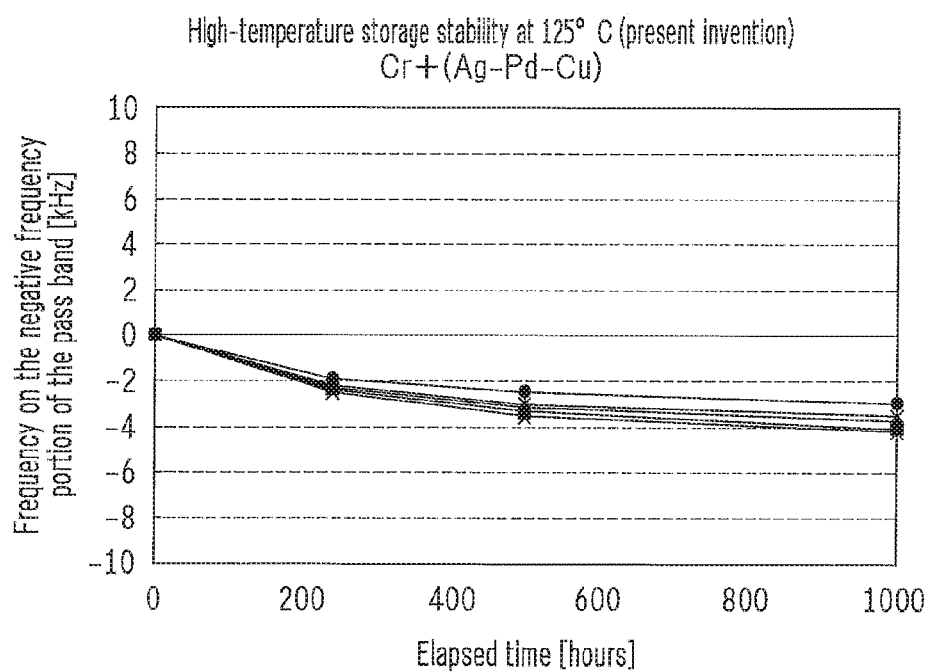
FIG. 14 is a graph showing high-temperature storage stability of crystal filters according to the present invention.
Figure 15:
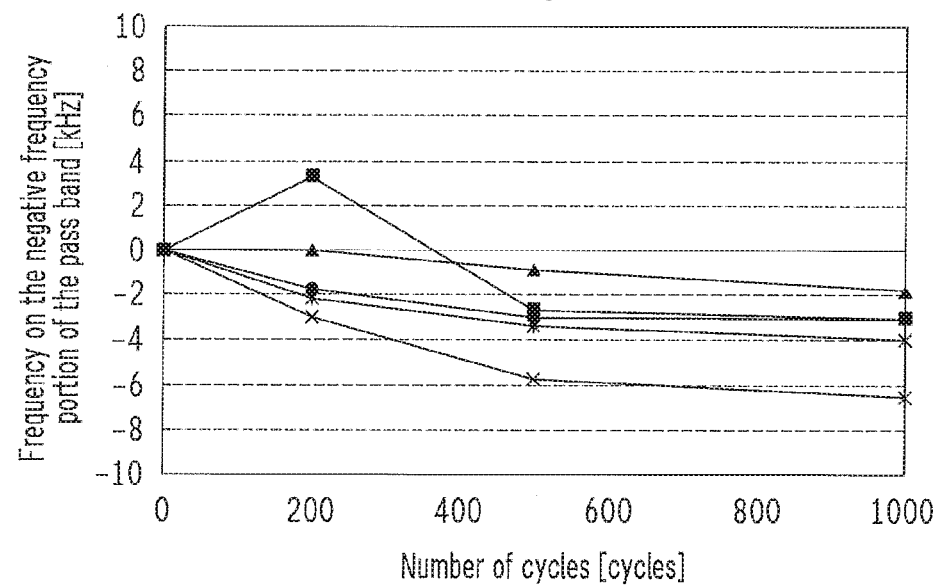
FIG. 15 is a graph showing hot-cold thermal shock properties of conventional crystal filters.
Figure 16:
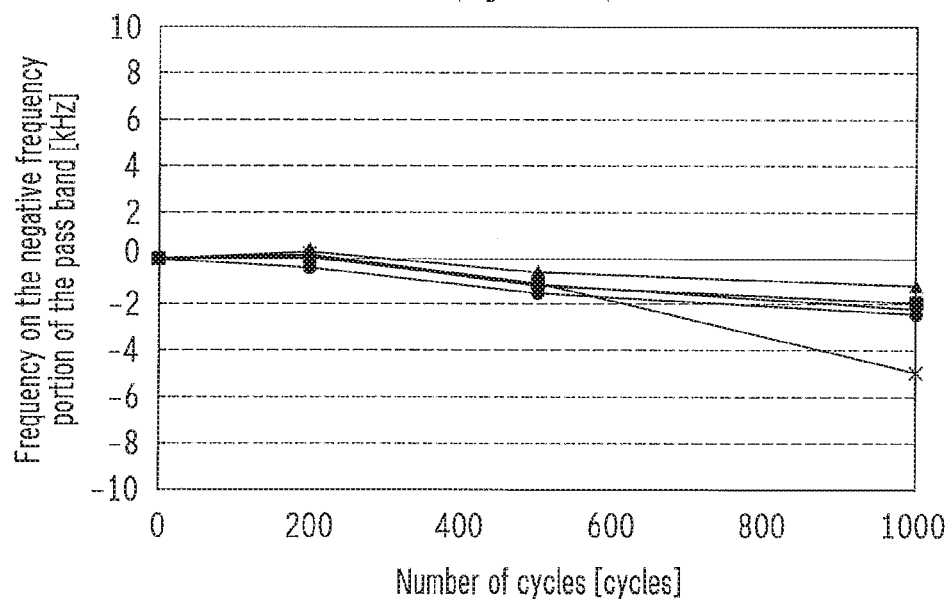
FIG. 16 is a graph showing hot-cold thermal shock properties of crystal filters according to the present invention.

According to the crystal resonator of the present invention described above, addition of palladium to silver makes the surfaces resistant to oxidation and can thereby enhance weatherability. Besides, copper, which is an element for forming a solid solution with silver, can enhance hardness of the electrodes and can improve thermal resistance of the crystal resonator using the crystal resonator element. These functions and effects are demonstrated by results of reliability tests on examples of the present invention in comparison with conventional examples, as shown in FIGS. 11 to 16. FIGS. 11 and 12 show the data obtained in an aging test. FIGS. 13 and 14 show the data obtained in a high-temperature storage stability test. FIGS. 15 and 16 show the data obtained in a hot-cold thermal shock property test.

The graphs in FIGS. 11 and 12 represent the results of an aging test (a service life test) at +85° C., for crystal resonators using inverted-mesa AT-cut crystal resonator elements (nominal frequency: 165.719 MHz in a fundamental vibration mode), by way of comparison between conventional examples (FIG. 11) and examples of the present invention (FIG. 12). In this aging test, crystal resonators were left in a test chamber set at +85° C. for a predetermined time, and changes in oscillation frequency were measured thereafter. In FIG. 12, each excitation electrode had a layer structure composed of a Cr foundation layer and an alloy (Ag—Pd—Cu alloy) layer laminated thereon and containing Ag as the major component, Pd as the first additive, and Cu as the second additive. In FIG. 11 representing conventional examples, on the other hand, each excitation electrode had a layer structure composed of a Cr foundation layer and a pure Ag layer laminated thereon (the same applies to FIGS. 13 and 15 which also represent conventional examples). Comparison between FIGS. 11 and 12 indicates that the crystal resonators according to the present invention are favorable because they show a gentler decrease and smaller variations in frequency deviation with passage of aging time as compared with those in the conventional examples.

The graphs in FIGS. 13 and 14 represent the results of a high-temperature storage test at +125° C., for monolithic crystal filters (nominal frequency: 156.525 MHz) using inverted-mesa AT-cut crystal resonator elements, by way of comparison between conventional examples (FIG. 13) and examples of the present invention (FIG. 14). In this high-temperature storage test, crystal resonators were left in a test chamber set at +125° C. for a predetermined time, and changes in oscillation frequency were measured thereafter. In FIG. 14, each excitation electrode had a layer structure composed of a Cr foundation layer and the Ag—Pd—Cu alloy layer laminated thereon. Comparison between FIGS. 13 and 14 indicates that the crystal filters according to the present invention are favorable because they show a gentler decrease and smaller variations in frequency on the negative frequency portion of the pass band with passage of time as compared with those in the conventional examples.

The graphs in FIGS. 15 and 16 represent the results of a hot-cold thermal shock test, for monolithic crystal filters (nominal frequency: 156.525 MHz) using inverted-mesa AT-cut crystal resonator elements, by way of comparison between conventional examples (FIG. 15) and examples of the present invention (FIG. 16). In this hot-cold thermal shock test, the temperature was changed between −55° C. and +125° C. in a predetermined temperature profile, which was taken as one cycle, and changes in frequency on the negative frequency portion of the pass band were measured after 200 cycles, 500 cycles, and 1000 cycles. In FIG. 16, each excitation electrode had a layer structure composed of a Cr foundation layer and the Ag—Pd—Cu alloy layer laminated thereon. Comparison between FIGS. 15 and 16 indicates that the crystal filters according to the present invention are favorable because they show a very little decrease and smaller variations in frequency on the negative frequency portion of the pass band with passage of time as compared with those in the conventional examples.

As understood from the above results, the present invention can provide a piezoelectric device which is excellent in thermal resistance and weatherability.

Figure 17:
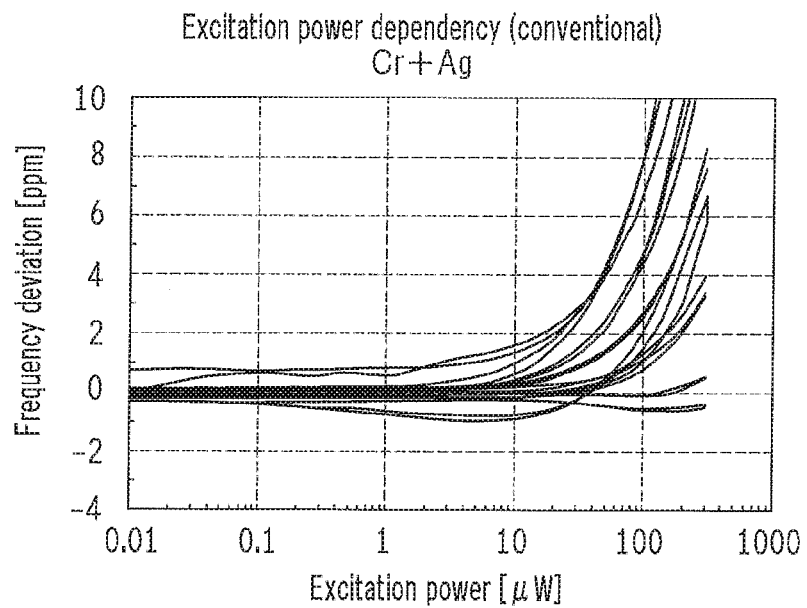
FIG. 17 is a graph showing excitation power dependency of conventional crystal resonators.
Figure 18:
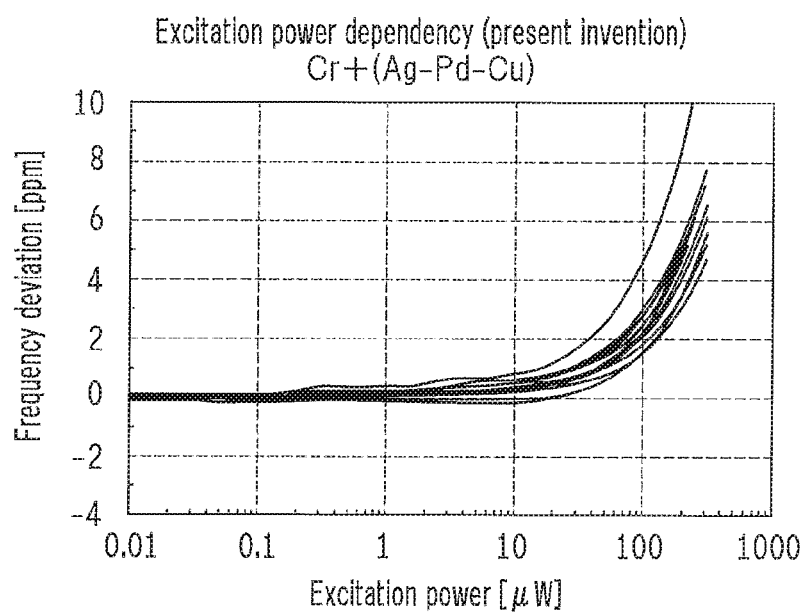
FIG. 18 is a graph showing excitation power dependency of crystal resonators according to the present invention.
Figure 19:
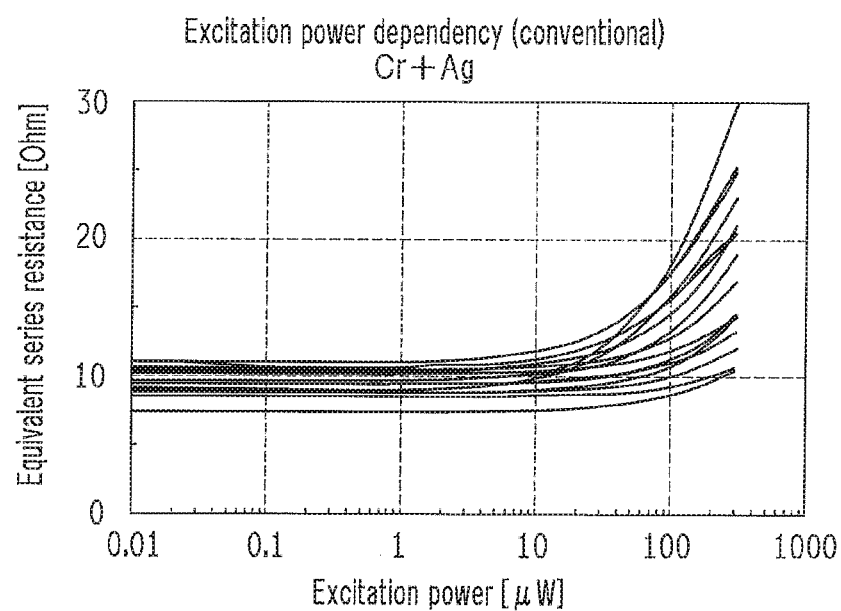
FIG. 19 is a graph showing excitation power dependency characteristics of conventional crystal resonators.
Figure 20:
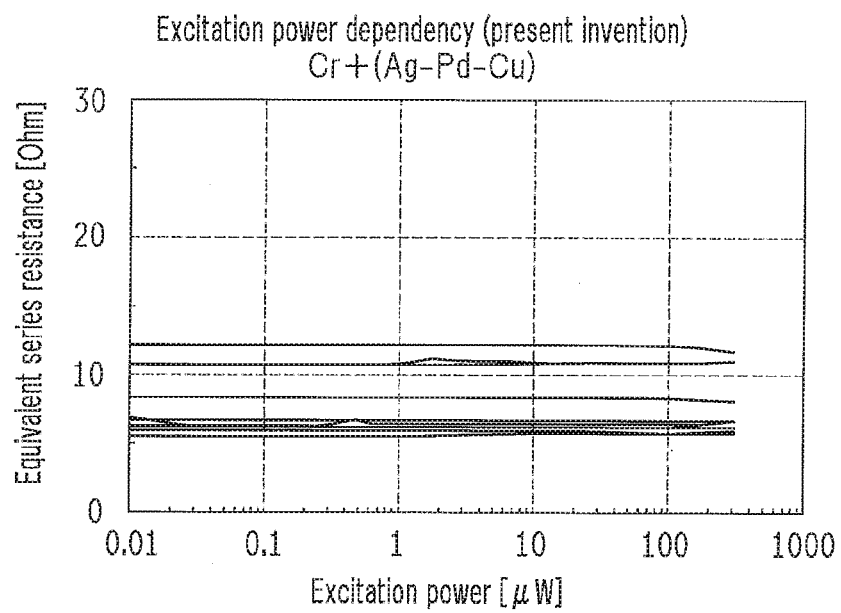
FIG. 20 is a graph showing excitation power dependency characteristics of crystal resonators according to the present invention.

The graphs in FIGS. 17 to 20 represent results of excitation power dependency (drive level characteristics), for crystal resonators (nominal frequency: 156.525 MHz) using inverted-mesa AT-cut crystal resonator elements, by way of comparison between conventional examples (FIGS. 17 and 19) and examples of the present invention (FIGS. 18 and 20). To evaluate excitation power dependency, changes in oscillation frequency and changes in equivalent series resistance were measured while the level of power application was gradually changed from a low excitation electric power (drive level) to a high excitation electric power. FIGS. 17 and 18 show changes in frequency deviation along with changes in excitation electric power. FIGS. 19 and 20 show changes in equivalent series resistance along with changes in excitation electric power. In FIGS. 18 and 20, each excitation electrode had a layer structure composed of a Cr foundation layer and an Ag—Pd—Cu alloy layer laminated thereon. Comparison of FIGS. 17 to 20 indicates that the crystal resonators according to the present invention show smaller changes and smaller variations in frequency deviation along with an increase in excitation electric power as compared with those in the conventional examples (having excitation electrodes each composed of a Cr foundation layer and a pure Ag layer laminated thereon). Further, the crystal resonators according to the present invention show smaller changes in equivalent series resistance along with an increase in excitation electric power as compared with those in the conventional examples.

Let us assume the reason for the above results. In the conventional examples (the foundation layer is covered by a pure Ag layer), oxide films are formed on the surfaces of the excitation electrodes and the extraction electrodes (including the adhesive electrodes in the present embodiment), which is likely to deteriorate the adhesion property between the extraction electrodes (specifically, the adhesive electrodes) and the conducting adhesives and to make the crystal resonators unstable. At this state, the conductivity resistance increases at the bonding interface between the extraction electrodes and the conducting adhesives, which is further likely to deteriorate the equivalent resistance in the crystal resonators. Eventually, the conventional crystal resonators show unstable characteristics in excitation power dependency.

In contrast, according to the present invention, the excitation electrodes, the extraction electrodes, and the adhesive electrodes contain Pd as the first additive, which makes the surfaces of the excitation electrodes, the extraction electrodes, and the adhesive electrodes resistant to oxidation. As a result, the adhesion property between the adhesive electrodes and the conducting adhesives improves and stabilizes the crystal resonators. At this state, the conductivity resistance decreases at the bonding interface between the adhesive electrodes and the conducting adhesives, which in turn reduces the equivalent resistance in the crystal resonators. Eventually, the present invention can provide a crystal resonator having a good excitation power dependency.

In the above embodiment of the present invention, a surface-mount crystal resonator is employed as an example. In addition, the present invention is applicable to other piezoelectric devices such as a crystal filter and a crystal oscillator.

The present invention can be embodied and practiced in other different forms without departing from the spirit and essential characteristics of the invention. Therefore, the above-described embodiment is considered in all respects as illustrative and not restrictive. The scope of the invention is indicated by the appended claims rather than by the foregoing description. All variations and modifications falling within the equivalency range of the appended claims are intended to be embraced therein.

This application claims priority to Japanese Patent Application No. 2013-218778 filed on Oct. 22, 2013, and Japanese Patent Application No. 2014-154231 filed on Jul. 29, 2014. The contents of these applications are incorporated herein by reference in their entirety.

INDUSTRIAL APPLICABILITY

The present invention is applicable to mass production of piezoelectric resonator elements and piezoelectric devices.

DESCRIPTION OF THE REFERENCE NUMERALS 1 crystal resonator
2 crystal resonator element
3 holder
23, 23a, 23b excitation electrode
9 first additive-rich region

The invention claimed is:

1. A piezoelectric resonator element comprising a pair of excitation electrodes for driving a piezoelectric resonator plate, wherein each of the excitation electrodes comprises a ternary alloy containing silver as a major component, a first additive, and a second additive, the first additive being a metal element which has a lower sputtering yield than silver and which is resistant to corrosion in an etching liquid, and the second additive being an element for forming a solid solution with silver, and wherein the first additive is at a higher concentration per unit volume at an outer periphery of each of the excitation electrodes.

2. The piezoelectric resonator element according to claim 1, wherein the alloy contains palladium as the first additive and copper as the second additive.

3. A piezoelectric device comprising the piezoelectric resonator element according to claim 1, wherein the piezoelectric resonator element is accommodated in a holder and hermetically sealed by a lid bonded on the holder.

* * * * *